(12) United States Patent
Pagaila

(10) Patent No.: US 9,324,672 B2
(45) Date of Patent: Apr. 26, 2016

(54) SEMICONDUCTOR DEVICE AND METHOD OF FORMING DUAL-ACTIVE SIDED SEMICONDUCTOR DIE IN FAN-OUT WAFER LEVEL CHIP SCALE PACKAGE

(75) Inventor: Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 783 days.

(21) Appl. No.: 12/545,390

(22) Filed: Aug. 21, 2009

(65) Prior Publication Data

US 2011/0045634 A1 Feb. 24, 2011

(51) Int. Cl.
*H01L 21/00* (2006.01)
*H01L 23/00* (2006.01)

(52) U.S. Cl.
CPC ............. *H01L 24/20* (2013.01); *H01L 24/19* (2013.01); *H01L 24/73* (2013.01); *H01L 2224/04105* (2013.01); *H01L 2224/20* (2013.01); *H01L 2224/211* (2013.01); *H01L 2224/48091* (2013.01); *H01L 2224/48463* (2013.01); *H01L 2924/01004* (2013.01); *H01L 2924/014* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L2924/1306* (2013.01); *H01L 2924/13091* (2013.01); *H01L 2924/14* (2013.01);

(Continued)

(58) Field of Classification Search
CPC ................ H01L 2924/00; H01L 2924/15311; H01L 2224/97; H01L 2224/73265; H01L 25/0657; H01L 24/48; H01L 23/5389; H01L 2224/32225; H01L 2224/48227; H01L 2924/00014; H01L 2224/16225; H01L 2224/73204; H01L 2924/181; H01L 2224/04105; H01L 2224/20; H01L 2224/211; H01L 2224/48463; H01L 24/19; H01L 2924/3025
USPC ............ 257/690, E21.499; 438/107, 126, 127
See application file for complete search history.

(56) References Cited

U.S. PATENT DOCUMENTS 5,250,843 A 10/1993 Eichelberger
5,353,498 A 10/1994 Fillion et al.

(Continued)

FOREIGN PATENT DOCUMENTS

TW 200903679 A 1/2009

*Primary Examiner* — Duy T Nguyen
(74) *Attorney, Agent, or Firm* — Robert D. Atkins; Patent Law Group: Atkins and Associates, P.C.

(57) ABSTRACT

In a semiconductor device, a plurality of conductive pillars is formed over a temporary carrier. A dual-active sided semiconductor die is mounted over the carrier between the conductive pillars. The semiconductor die has first and second opposing active surfaces with first contact pads on the first active surface and second contact pads on the second active surface. An encapsulant is deposited over the semiconductor die and temporary carrier. A first interconnect structure is formed over a first surface of the encapsulant. The first interconnect structure is electrically connected to the conductive pillars and first contact pads of the dual-active sided semiconductor die. The temporary carrier is removed. A second interconnect structure is formed over a second surface of the encapsulant opposite the first surface of the encapsulant. The second interconnect structure is electrically connected to the conductive pillars and second contact pads of the dual-active sided semiconductor die.

20 Claims, 7 Drawing Sheets

(52) U.S. Cl.
CPC ............... *H01L2924/1433* (2013.01); *H01L 2924/15311* (2013.01); *H01L 2924/181* (2013.01); *H01L 2924/19041* (2013.01); *H01L 2924/3025* (2013.01); *H01L 2924/30105* (2013.01)

(56) References Cited

U.S. PATENT DOCUMENTS

| | | | |
|---|---|---|---|
| 5,841,193 A | 11/1998 | Eichelberger | |
| 7,413,928 B2 | 8/2008 | Doan | |
| 7,462,509 B2 | 12/2008 | Bernstein et al. | |
| 7,619,901 B2 | 11/2009 | Eichelberger et al. | |
| 2002/0074637 A1 | 6/2002 | McFarland | |
| 2005/0067714 A1 | 3/2005 | Rumer et al. | |
| 2006/0226521 A1* | 10/2006 | Coyle et al. | 257/666 |
| 2006/0264023 A1* | 11/2006 | Doan | 438/613 |
| 2007/0267746 A1* | 11/2007 | Bernstein et al. | 257/738 |
| 2008/0246126 A1* | 10/2008 | Bowles et al. | 257/659 |
| 2009/0001593 A1 | 1/2009 | Do et al. | |
| 2009/0051031 A1* | 2/2009 | Lai et al. | 257/738 |
| 2009/0152740 A1* | 6/2009 | Park et al. | 257/778 |
| 2009/0309212 A1* | 12/2009 | Shim et al. | 257/700 |

\* cited by examiner

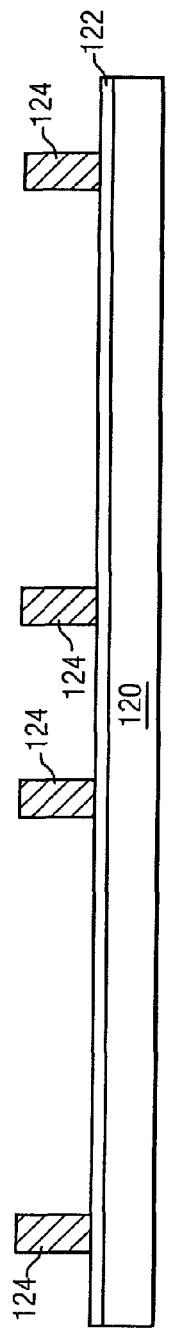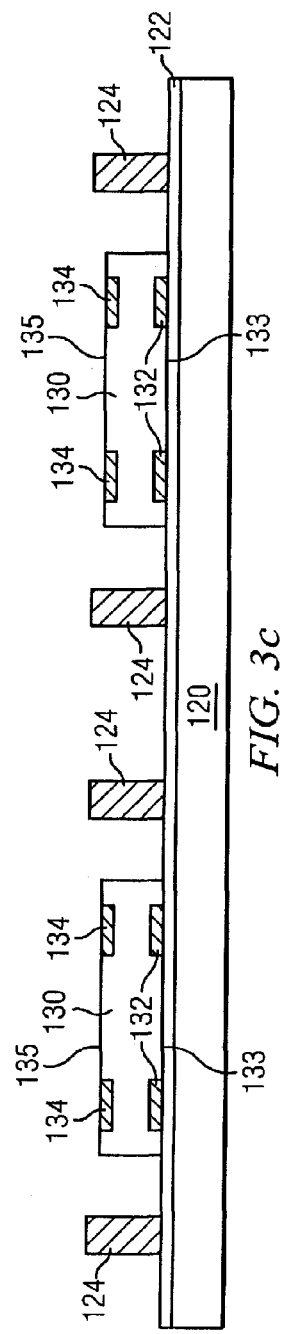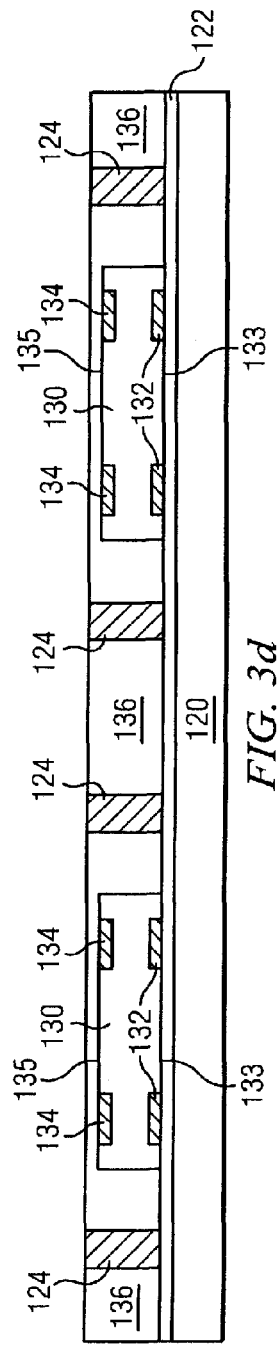

SEMICONDUCTOR DEVICE AND METHOD OF FORMING DUAL-ACTIVE SIDED SEMICONDUCTOR DIE IN FAN-OUT WAFER LEVEL CHIP SCALE PACKAGE

FIELD OF THE INVENTION

The present invention relates in general to semiconductor devices and, more particularly, to a semiconductor device and method of forming one or more dual-active sided semiconductor die in a fan-out wafer level chip scale package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection in a fan-out wafer level chip scale package (FO-WLCSP) containing semiconductor devices stacked on multiple levels can be accomplished with conductive through silicon vias (TSV), through hole vias (THV), or Cu-plated conductive pillars. Vias are formed in silicon or organic material around the die using laser drilling or deep reactive ion etching (DRIE). The vias are filled with conductive material, for example by copper deposition using an electroplating process, to form the conductive TSVs and THVs. The TSVs and THVs further connect through build-up interconnect structures which are formed across each semiconductor die. The TSVs and THVs and build-up interconnect structure have limited input/output (I/O) pin count and interconnect capability, particularly for FO-WLCSP.

SUMMARY OF THE INVENTION

A need exists for a higher I/O pin count in FO-WLCSP. Accordingly, in one embodiment, the present invention is a method of making a semiconductor device comprising the steps of providing a temporary carrier, forming a plurality of conductive pillars over the temporary carrier, and mounting a first semiconductor die over the temporary carrier between the conductive pillars. The first semiconductor die has first and second opposing active surfaces with first contact pads on the first active surface and second contact pads on the second active surface. The method further includes the steps of depositing an encapsulant over the first semiconductor die and temporary carrier, and forming a first interconnect structure over a first surface of the encapsulant. The first interconnect structure is electrically connected to the conductive pillars and first contact pads of the first semiconductor die. The method further includes the steps of removing the temporary carrier, and forming a second interconnect structure over a second surface of the encapsulant opposite the first surface of the encapsulant. The second interconnect structure is electrically connected to the conductive pillars and second contact pads of the first semiconductor die.

In another embodiment, the present invention is a method of making a semiconductor device comprising the steps of forming a plurality of conductive pillars, and mounting a first semiconductor component between the conductive pillars. The first semiconductor component has first and second opposing active surfaces with first contact pads on the first active surface and second contact pads on the second active surface. The method further includes the steps of depositing an encapsulant over the first semiconductor component, and forming a first interconnect structure over a first surface of the encapsulant. The first interconnect structure is electrically connected to the conductive pillars and first contact pads of the first semiconductor component.

In another embodiment, the present invention is a method of making a semiconductor device comprising the step of mounting a first semiconductor component between the conductive pillars. The first semiconductor component has first and second opposing active surfaces with first contact pads on the first active surface and second contact pads on the second active surface. The method further includes the steps of depositing an encapsulant over the first semiconductor component, and forming a first interconnect structure over a first surface of the encapsulant. The first interconnect structure is electrically connected to the first contact pads of the first semiconductor component.

In another embodiment, the present invention is a semiconductor device comprising a plurality of conductive pillars and first semiconductor component mounted between the conductive pillars. The first semiconductor component has first and second opposing active surfaces with first contact pads on the first active surface and second contact pads on the second active surface. An encapsulant is deposited over the first semiconductor component. A first interconnect structure is formed over a first surface of the encapsulant. The first interconnect structure is electrically connected to the conductive pillars and first contact pads of the first semiconductor component.

BRIEF DESCRIPTION OF THE DRAWINGS

FIGS. 3a-3h illustrate a process of forming a dual-active sided die in a FO-WLCSP;

DETAILED DESCRIPTION OF THE DRAWINGS

Figure 1:
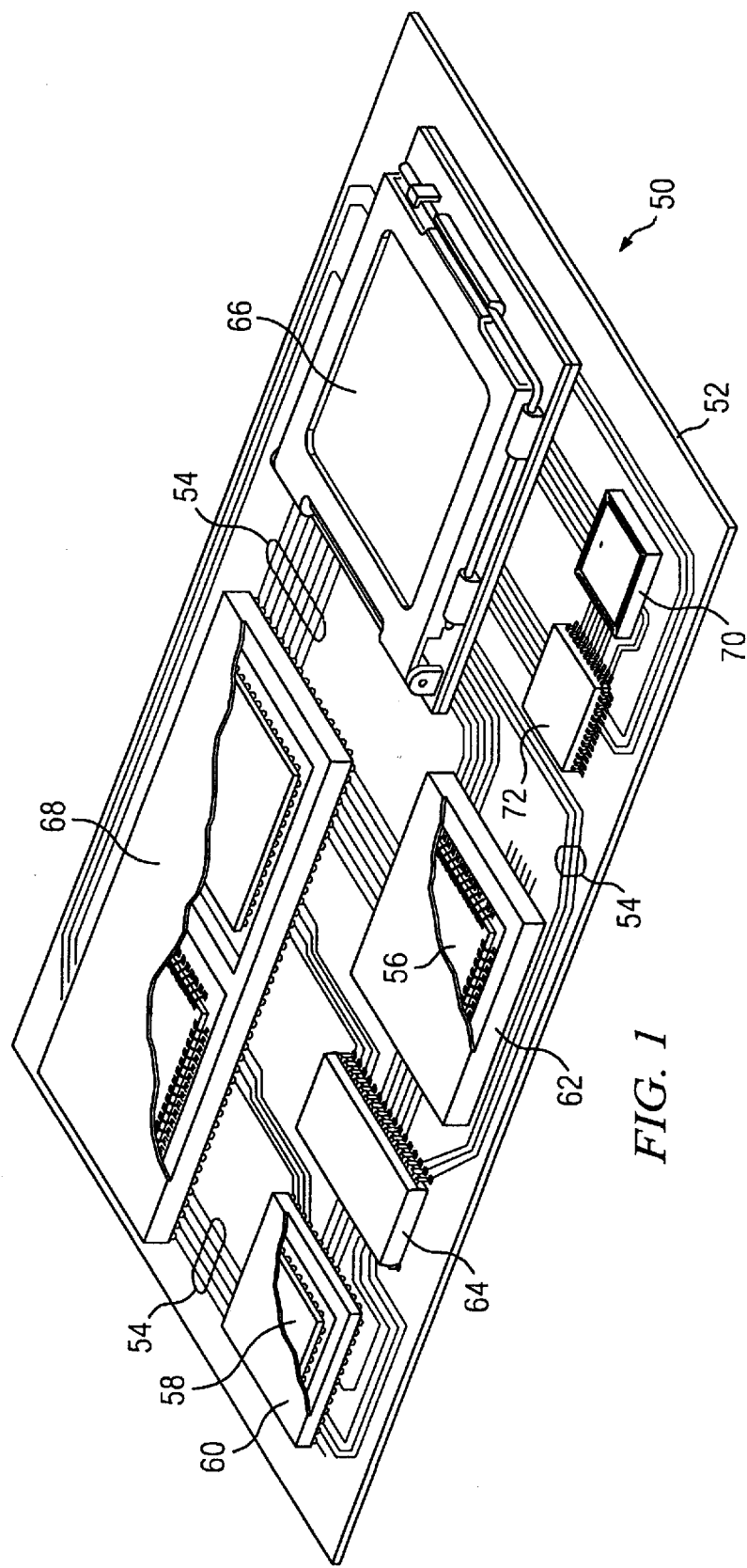
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
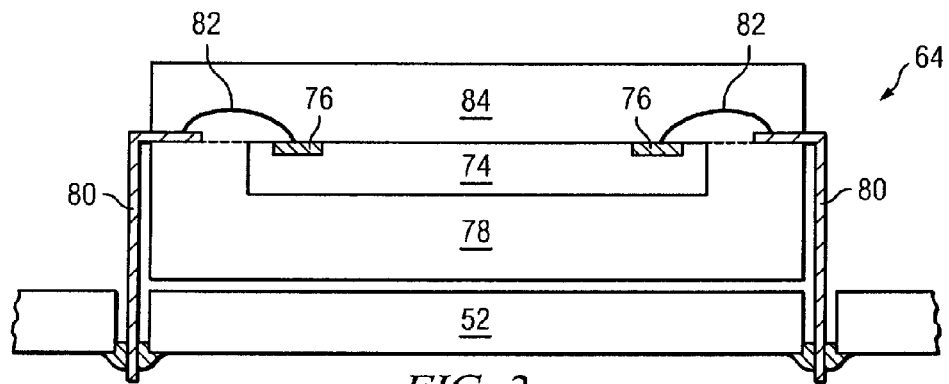
FIGS. 2a-2c illustrate further detail of the representative semiconductor packages mounted to the PCB.
Figure 2B:
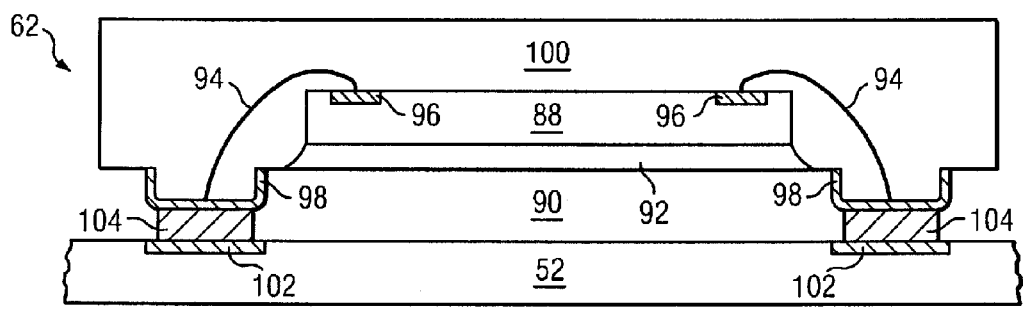
Figure 2C:
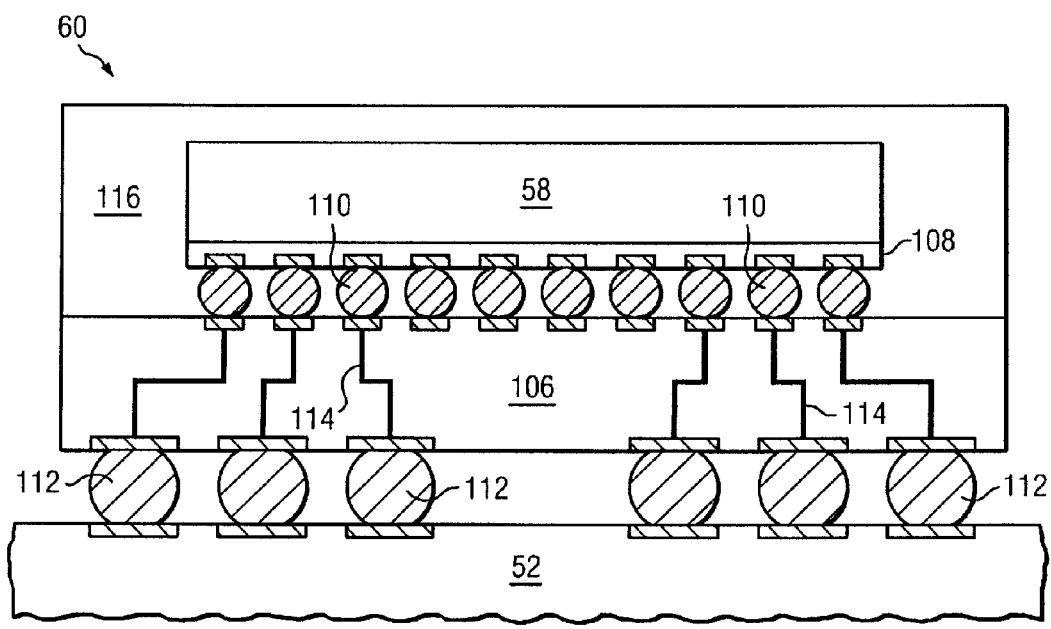

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3E:
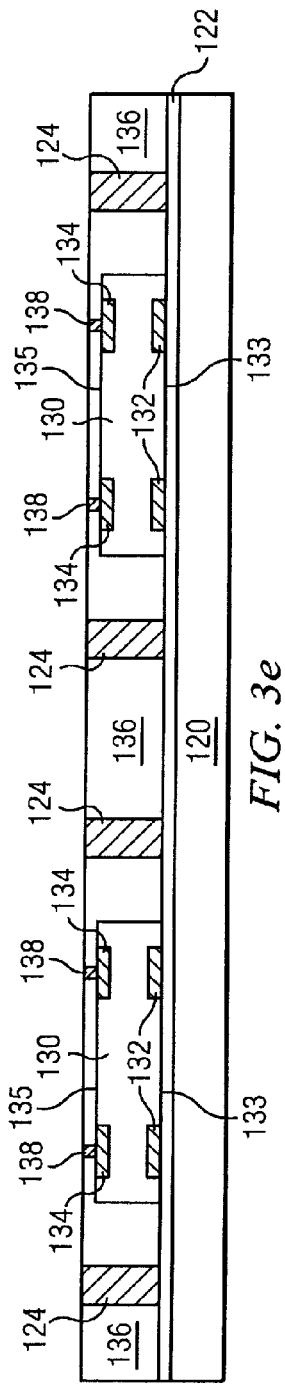

FIGS. 3a-3h illustrate, in relation to FIGS. 1 and 2a-2c, a process of forming a dual-active sided semiconductor die in a FO-WLCSP. In FIG. 3a, a wafer-form substrate or carrier 120 contains temporary or sacrificial base material such as silicon, polymer, polymer composite, metal, ceramic, glass, glass epoxy, beryllium oxide, or other suitable low-cost, rigid material or bulk semiconductor material for structural support. In one embodiment, carrier 120 is 20.3 centimeters (cm) in diameter. An optional interface layer 122 can be formed over carrier 120 as a temporary bonding film or etch-stop layer.

In FIG. 3b, one or more layers of photoresist are deposited over interface layer 122. The photoresist extends above semiconductor die 130, as described in FIG. 3c. A portion of the photoresist is exposed and removed by an etch development process to form vias. Conductive material, such as Al, Cu, Sn, Ni, Au, Ag, titanium (Ti), tungsten (W), solder, poly-silicon, or combination thereof, is deposited in the vias using a selective plating process. The photoresist is stripped away leaving behind individual conductive pillars 124. In another embodiment, conductive pillars 124 can be formed as stud bumps or stacked bumps.

In FIG. 3c, dual-active sided semiconductor die or components 130 are mounted to interface layer 122 between conductive pillars 124. The dual-sided semiconductor die 130 has first and second opposing active surfaces with contact pads 132 on active surface 133 oriented toward carrier 120 and contact pads 134 on active surface 135 oriented upward away from carrier 120. Conductive pillars 124 have a height greater than the thickness of semiconductor die 130. Each active surface of semiconductor die 130 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surfaces 133 and 135 to implement analog circuits or digital circuits, such as digital signal processor (DSP), ASIC, memory, or other signal processing circuit. Semiconductor die 130 may also contain IPD, such as inductors, capacitors, and resistors, for RF signal processing. A typical RF system requires multiple IPDs in one or more semiconductor packages to perform the necessary electrical functions.

In FIG. 3d, an encapsulant or molding compound 136 is deposited over semiconductor die 130 using a paste printing, compressive molding, transfer molding, liquid encapsulant molding, vacuum lamination, spin coating, or other suitable applicator. Encapsulant 136 can be polymer composite material, such as epoxy resin with filler, epoxy acrylate with filler, or polymer with proper filler. Encapsulant 136 is non-conductive and environmentally protects the semiconductor device from external elements and contaminants. Encapsulant 136 is planarized to expose conductive pillars 124.

In FIG. 3e, a plurality of vias is formed in encapsulant 136 over contact pads 134 using laser drilling or etching process, such as DRIE. The vias are filled with Al, Cu, Sn, Ni, Au, Ag, titanium (Ti), W, poly-silicon, or other suitable electrically conductive material using PVD, CVD, electrolytic plating, electroless plating process, or other suitable metal deposition process to form conductive THV 138. Conductive THV 138 are electrically connected to contact pads 134.

Figure 3F:
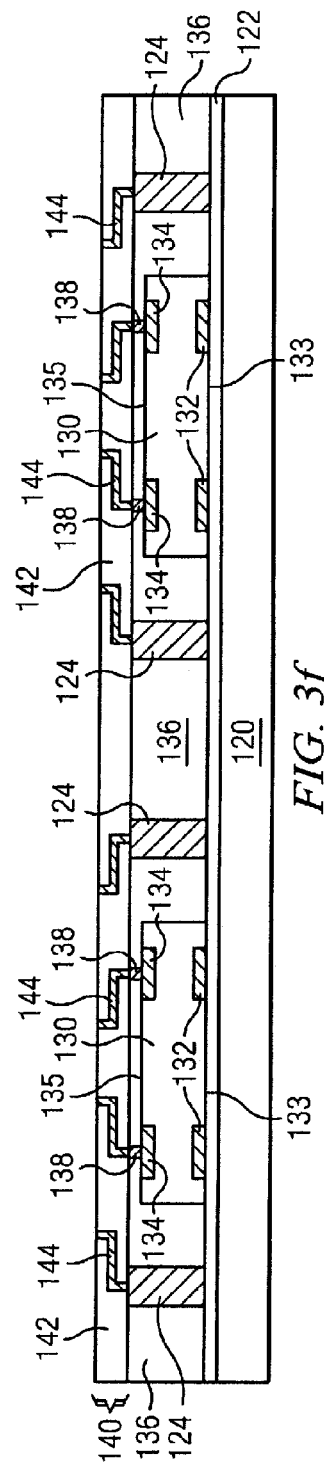

In FIG. 3f, a topside build-up interconnect structure 140 is formed over conductive pillars 124, semiconductor die 130, and encapsulant 136. The build-up interconnect structure 140 includes an insulating or passivation layer 142 containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 142 is formed using PVD, CVD, printing, spin coating, spray coating, sintering or thermal oxidation.

The topside build-up interconnect structure 140 further includes an electrically conductive layer 144 formed in insulating layer 142 using a patterning and deposition process such as PVD, CVD, sputtering, electrolytic plating, and electroless plating. Conductive layer 144 can be one or more layers of Al, Cu, Sn, Ni, Au, Ag, or other suitable electrically conductive material. One portion of conductive layer 144 is electrically connected to conductive pillars 124 and contact pads 134 of semiconductor die 130. Other portions of conductive layer 144 can be electrically common or electrically isolated depending on the design and function of the semiconductor device.

Figure 3G:
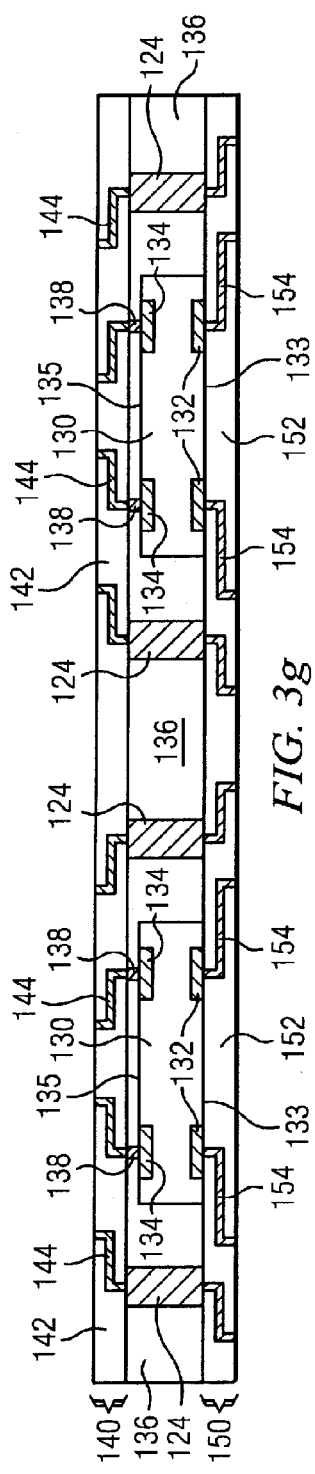

In FIG. 3g, carrier 120 and optional interface layer 122 are removed by chemical etching, mechanical peel-off, CMP, mechanical grinding, thermal bake, laser scanning, or wet stripping. A bottom-side build-up interconnect structure 150 is formed over conductive pillars 124, semiconductor die 130, and encapsulant 136, opposite build-up interconnect structure 140. The build-up interconnect structure 150 includes an insulating or passivation layer 152 containing one or more layers of SiO2, Si3N4, SiON, Ta2O5, Al2O3, or other material having similar insulating and structural properties. The insulating layer 152 is formed using PVD, CVD, printing, spin coating, spray coating, sintering or thermal oxidation.

The bottom-side build-up interconnect structure 150 further includes an electrically conductive layer 154 formed in insulating layer 152 using a patterning and deposition process such as PVD, CVD, sputtering, electrolytic plating, electroless plating. Conductive layer 154 can be one or more layers of Al, Cu, Sn, Ni, Au, Ag, or other suitable electrically conductive material. One portion of conductive layer 154 is electrically connected to conductive pillars 124 and contact pads 132 of semiconductor die 130. Other portions of conductive layer 154 can be electrically common or electrically isolated depending on the design and function of the semiconductor device.

Figure 3H:
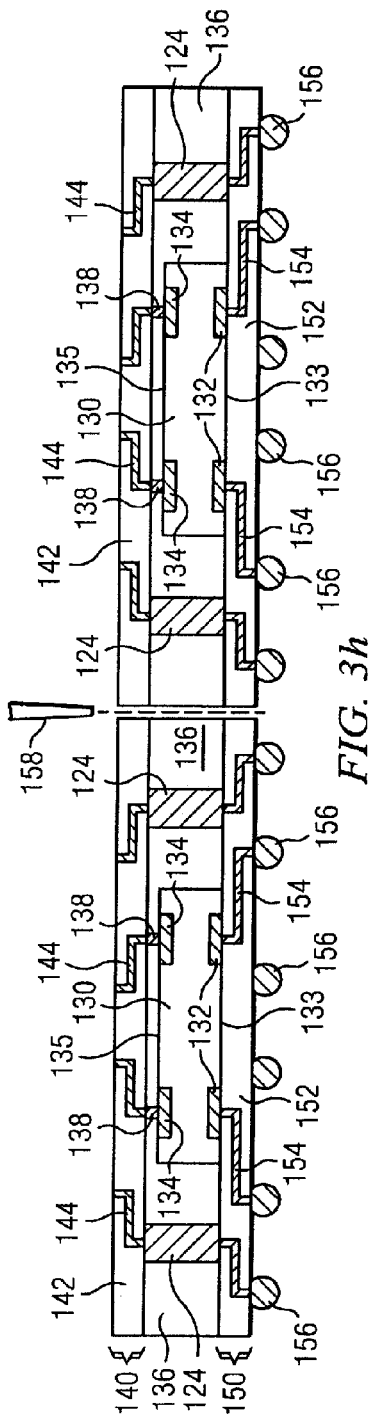

In FIG. 3h, an electrically conductive bump material is deposited over build-up interconnect structure 150 and electrically connected to conductive layer 154 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 154 using a suitable attachment or bonding process. In one embodiment, the bump material is reflowed by heating the material above its melting point to form spherical balls or bumps 156. In some applications, bumps 156 are reflowed a second time to improve electrical contact to conductive layer 154. The bumps can also be compression bonded to conductive layer 154. Bumps 156 represent one type of interconnect structure that can be formed over conductive layer 154. The interconnect structure can also use bond wires, stud bump, micro bump, or other electrical interconnect.

Figure 4:
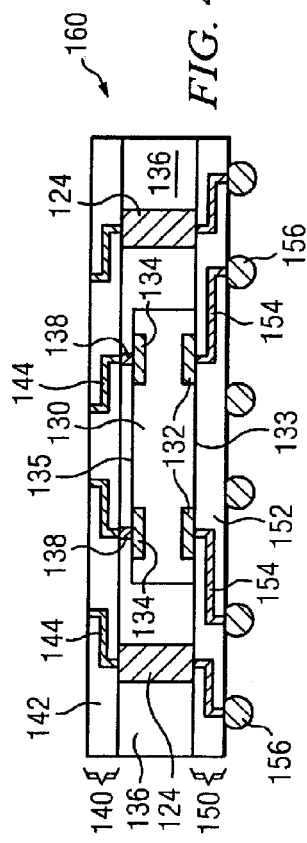
FIG. 4 illustrates the dual-active sided semiconductor die in the FO-WLCSP.

Semiconductor die 130 are singulated with saw blade or laser cutting device 158 into individual FO-WLCSP. FIG. 4 shows FO-WLCSP 160 after singulation. The dual-sided semiconductor die 130 has lower contact pads 132 on active surface 133 and upper contact pads 134 on active surface 135 of the die, which are embedded in encapsulant 136. The upper contact pads 134 are electrically connected through conductive vias 138 to build-up interconnect structure 140. The lower contact pads 132 are electrically connected to build-up interconnect structure 150. The build-up interconnect structures 140 and 150 are electrically connected through z-direction interconnect conductive pillars 124. FO-WLCSP 160, with dual-active sided semiconductor die 130, provides a higher I/O pin count with greater flexibility for interconnect to other semiconductor devices.

Figure 5:
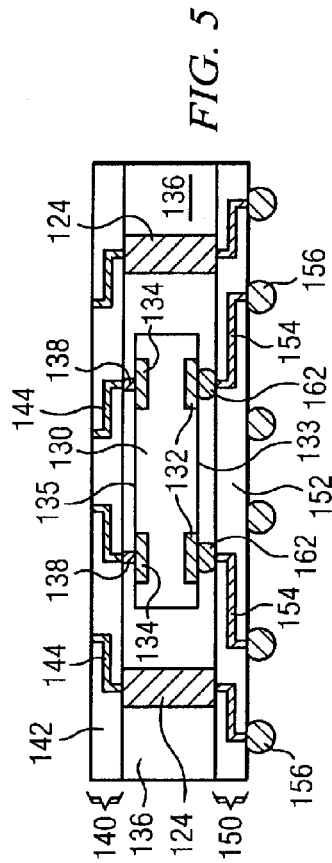
FIG. 5 illustrates the dual-active sided semiconductor die with one side bumped.

FIG. 5 shows the FO-WLCSP with dual-active sided die, as described in FIGS. 3a-3h, in a one-side bumped configuration. Bumps 162 are formed between contact pads 132 and conductive layer 154 in bottom-side build-up interconnect structure 150.

Figure 6:
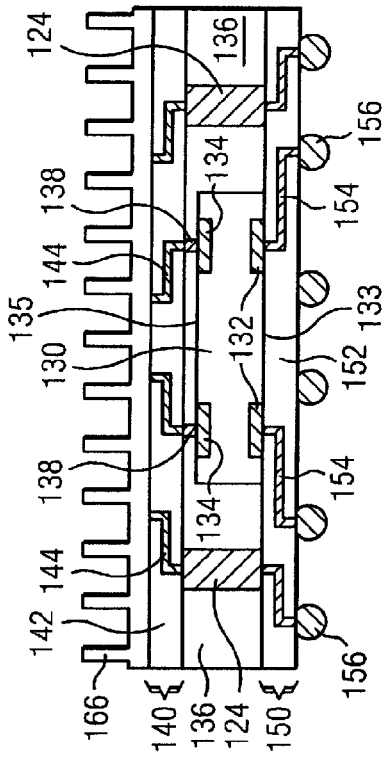
FIG. 6 illustrates the dual-active sided semiconductor die with two sides bumped.

FIG. 6 shows the FO-WLCSP with dual-active sided die, as described in FIGS. 3a-3h, in a two-side bumped configuration. Bumps 162 are formed between contact pads 132 and conductive layer 154 in bottom-side build-up interconnect structure 150. Bumps 164 are formed between contact pads 134 and conductive layer 144 in topside build-up interconnect structure 140.

Figure 7:
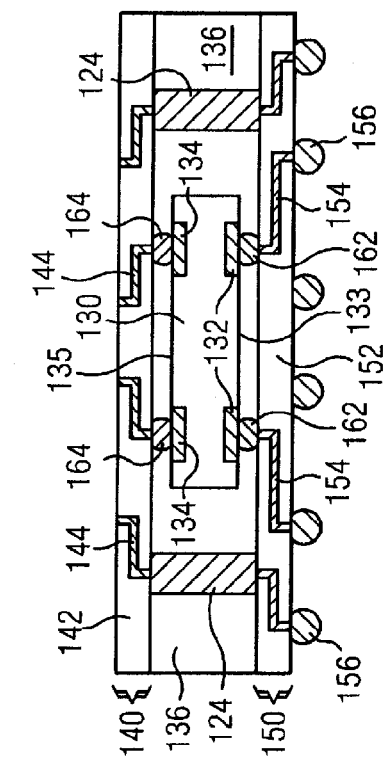
FIG. 7 illustrates the dual-active sided semiconductor die with a heat sink.

FIG. 7 shows the FO-WLCSP with dual-active sided die, as described in FIGS. 3a-3h, and heat sink 166 mounted over topside build-up interconnect structure 140. Heat sink 166 can be Al, Cu, or another material with high thermal conductivity to provide heat dissipation for semiconductor die 130.

Figure 8:
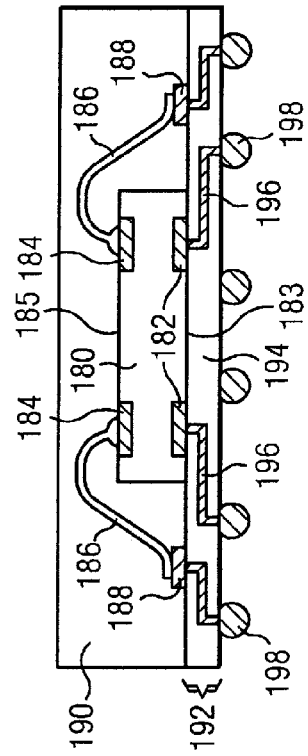
FIG. 8 illustrates the two vertically stacked dual-active sided semiconductor die in the FO-WLCSP.

In the embodiment of FIG. 8, the FO-WLCSP with dual-active sided die follows a similar process as described in FIGS. 3a-3b. Conductive pillars 124 are made of sufficient height to extend above two stacked semiconductor die. A dual-active sided semiconductor die 170 is mounted to semiconductor die 130. Contact pads 172 of semiconductor die 170 are electrically connected to contact pads 134 of semiconductor die 130 with bumps 174. The remainder of the embodiment shown in FIG. 8 follows a similar process as described in FIGS. 3c-3h.

Figure 9:
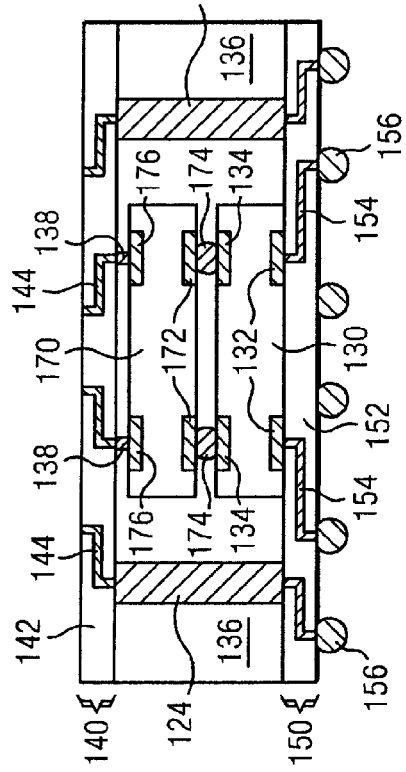
FIG. 9 illustrates the dual-active sided semiconductor die in the FO-WLCSP with bond wires.

In FIG. 9, a dual-active sided semiconductor die or component 180 is mounted to a temporary carrier. The dual-sided semiconductor die 180 has first and second opposing active surfaces with contact pads 182 on active surface 183 oriented toward the carrier and contact pads 184 on active surface 185 oriented upward away from the carrier. Each active surface of semiconductor die 180 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surfaces 184 and 185 to implement analog circuits or digital circuits, such as DSP, ASIC, memory, or other signal processing circuit. Semiconductor die 180 may also contain IPD, such as inductors, capacitors, and resistors, for RF signal processing. A typical RF system requires multiple IPDs in one or more semiconductor packages to perform the necessary electrical functions.

Bond wires 186 are formed between contact pads 184 and contact pads 188 on the carrier. An encapsulant or molding compound 190 is deposited over semiconductor die 180 using a paste printing, compressive molding, transfer molding, liquid encapsulant molding, vacuum lamination, spin coating, or other suitable applicator. Encapsulant 190 can be polymer composite material, such as epoxy resin with filler, epoxy acrylate with filler, or polymer with proper filler. Encapsulant 190 is non-conductive and environmentally protects the semiconductor device from external elements and contaminants.

The temporary carrier is removed by chemical etching, mechanical peel-off, CMP, mechanical grinding, thermal bake, laser scanning, or wet stripping. A bottom-side build-up interconnect structure 192 is formed over semiconductor die 180 and encapsulant 190. The build-up interconnect structure 192 includes an insulating or passivation layer 194 containing one or more layers of SiO2, Si3N4, SiON, Ta2O5, Al2O3, or other material having similar insulating and structural properties. The insulating layer 194 is formed using PVD, CVD, printing, spin coating, spray coating, sintering or thermal oxidation.

The bottom-side build-up interconnect structure 192 further includes an electrically conductive layer 196 formed in insulating layer 194 using a patterning and deposition process such as PVD, CVD, sputtering, electrolytic plating, electroless plating process. Conductive layer 196 can be one or more layers of Al, Cu, Sn, Ni, Au, Ag, or other suitable electrically conductive material. One portion of conductive layer 196 is electrically connected to contact pads 182 of semiconductor die 180. Other portions of conductive layer 196 can be electrically common or electrically isolated depending on the design and function of the semiconductor device.

An electrically conductive bump material is deposited over build-up interconnect structure 192 and electrically connected to conductive layer 196 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 196 using a suitable attachment or bonding process. In one embodiment, the bump material is reflowed by heating the material above its melting point to form spherical balls or bumps 198. In some applications, bumps 198 are reflowed a second time to improve electrical contact to conductive layer 196. The bumps can also be compression bonded to conductive layer 196. Bumps 198 represent one type of interconnect structure that can be formed over conductive layer 196. The interconnect structure can also use bond wires, stud bump, micro bump, or other electrical interconnect.

Figure 10:
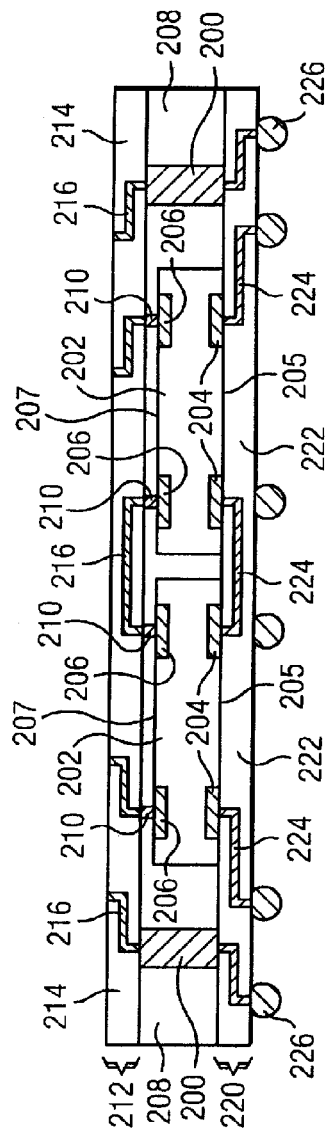
FIG. 10 illustrates two side-by-side dual-active sided semiconductor die in the FO-WLCSP.

In FIG. 10, one or more layers of photoresist are deposited over a temporary carrier. A portion of the photoresist is exposed and removed by an etch development process to form vias. Conductive material, such as Al, Cu, Sn, Ni, Au, Ag, Ti, W, solder, poly-silicon, or combination thereof, is deposited in the vias using a selective plating process. The photoresist is stripped away leaving behind individual conductive pillars 200. In another embodiment, conductive pillars 200 can be formed as stud bumps or stacked bumps.

Two side-by-side dual-active sided semiconductor die or components 202 are mounted to a temporary carrier. Each dual-sided semiconductor die 202 has first and second opposing active surfaces with contact pads 204 on active surface 205 oriented toward the carrier and contact pads 206 on active surface 207 oriented upward away from the carrier. Each active surface of each semiconductor die 202 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surfaces 205 and 207 to implement analog circuits or digital circuits, such as DSP, ASIC, memory, or other signal processing circuit. Semiconductor die 202 may also contain IPD, such as inductors, capacitors, and resistors, for RF signal processing. A typical RF system requires multiple IPDs in one or more semiconductor packages to perform the necessary electrical functions.

An encapsulant or molding compound 208 is deposited over semiconductor die 202 using a paste printing, compressive molding, transfer molding, liquid encapsulant molding, vacuum lamination, spin coating, or other suitable applicator. Encapsulant 208 can be polymer composite material, such as epoxy resin with filler, epoxy acrylate with filler, or polymer with proper filler. Encapsulant 208 is non-conductive and environmentally protects the semiconductor device from external elements and contaminants. Encapsulant 208 is planarized to expose conductive pillars 200.

A plurality of vias is formed in encapsulant 208 over contact pads 206 using laser drilling or etching process, such as DRIE. The vias are filled with Al, Cu, Sn, Ni, Au, Ag, Ti, W, poly-silicon, or other suitable electrically conductive material using PVD, CVD, electrolytic plating, electroless plating process, or other suitable metal deposition process to form conductive THV 210. Conductive THV 210 are electrically connected to contact pads 206.

A topside build-up interconnect structure 212 is formed over conductive pillars 200, semiconductor die 202, and encapsulant 208. The build-up interconnect structure 212 includes an insulating or passivation layer 214 containing one or more layers of SiO2, Si3N4, SiON, Ta2O5, Al2O3, or other material having similar insulating and structural properties. The insulating layer 214 is formed using PVD, CVD, printing, spin coating, spray coating, sintering or thermal oxidation.

The topside build-up interconnect structure 212 further includes an electrically conductive layer 216 formed in insulating layer 214 using a patterning and deposition process such as using PVD, CVD, sputtering, electrolytic plating, electroless plating process. Conductive layer 216 can be one or more layers of Al, Cu, Sn, Ni, Au, Ag, or other suitable electrically conductive material. One portion of conductive layer 216 is electrically connected to conductive pillars 200 and contact pads 206 of semiconductor die 202. Other portions of conductive layer 216 can be electrically common or electrically isolated depending on the design and function of the semiconductor device.

The temporary carrier is removed by chemical etching, mechanical peel-off, CMP, mechanical grinding, thermal bake, laser scanning, or wet stripping. A bottom-side build-up interconnect structure 220 is formed over conductive pillars 200, semiconductor die 202, and encapsulant 208, opposite build-up interconnect structure 212. The build-up interconnect structure 220 includes an insulating or passivation layer 222 containing one or more layers of SiO2, Si3N4, SiON, Ta2O5, Al2O3, or other material having similar insulating and structural properties. The insulating layer 222 is formed using PVD, CVD, printing, spin coating, spray coating, sintering or thermal oxidation.

The bottom-side build-up interconnect structure 220 further includes an electrically conductive layer 224 formed in insulating layer 222 using a patterning and deposition process such as PVD, CVD, sputtering, electrolytic plating, electroless plating process. Conductive layer 224 can be one or more layers of Al, Cu, Sn, Ni, Au, Ag, or other suitable electrically conductive material. One portion of conductive layer 224 is electrically connected to conductive pillars 200 and contact pads 204 of semiconductor die 202. Other portions of conductive layer 224 can be electrically common or electrically isolated depending on the design and function of the semiconductor device.

An electrically conductive bump material is deposited over build-up interconnect structure 220 and electrically connected to conductive layer 224 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 224 using a suitable attachment or bonding process. In one embodiment, the bump material is reflowed by heating the material above its melting point to form spherical balls or bumps 226. In some applications, bumps 226 are reflowed a second time to improve electrical contact to conductive layer 224. The bumps can also be compression bonded to conductive layer 224. Bumps 226 represent one type of interconnect structure that can be formed over conductive layer 224. The interconnect structure can also use bond wires, stud bump, micro bump, or other electrical interconnect.

Figure 11:
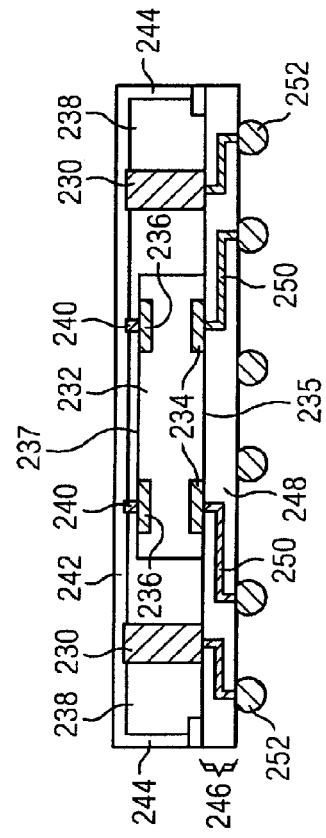
FIG. 11 illustrates the dual-active sided semiconductor die with EMI shielding in the FO-WLCSP.

In FIG. 11, one or more layers of photoresist are deposited over a temporary carrier. A portion of the photoresist is exposed and removed by an etch development process to form vias. Conductive material, such as Al, Cu, Sn, Ni, Au, Ag, Ti, W, solder, poly-silicon, or combination thereof, is deposited in the vias using a selective plating process. The photoresist is stripped away leaving behind individual conductive pillars 230. In another embodiment, conductive pillars 230 can be formed as stud bumps or stacked bumps.

A dual-active sided semiconductor die or component 232 is mounted to a temporary carrier. The dual-sided semiconductor die 232 has first and second opposing active surfaces with contact pads 234 on active surface 235 oriented toward the carrier and contact pads 236 on active surface 237 oriented upward away from the carrier. Each active surface of semiconductor die 232 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surfaces 235 and 237 to implement analog circuits or digital circuits, such as DSP, ASIC, memory, or other signal processing circuit. Semiconductor die 232 may also contain IPD, such as inductors, capacitors, and resistors, for RF signal processing. A typical RF system requires multiple IPDs in one or more semiconductor packages to perform the necessary electrical functions.

An encapsulant or molding compound 238 is deposited over semiconductor die 232 using a paste printing, compressive molding, transfer molding, liquid encapsulant molding, vacuum lamination, spin coating, or other suitable applicator. Encapsulant 238 can be polymer composite material, such as epoxy resin with filler, epoxy acrylate with filler, or polymer with proper filler. Encapsulant 238 is non-conductive and environmentally protects the semiconductor device from external elements and contaminants. Encapsulant 238 is planarized to expose conductive pillars 230.

A plurality of vias is formed in encapsulant 238 over contact pads 236 using laser drilling or etching process, such as DRIE. The vias are filled with Al, Cu, Sn, Ni, Au, Ag, Ti, W, poly-silicon, or other suitable electrically conductive material using PVD, CVD, electrolytic plating, electroless plating process, or other suitable metal deposition process to form conductive THV 240. Conductive THV 240 are electrically connected to contact pads 236.

A shielding layer 242 is formed over encapsulant 238 and semiconductor die 232. Shielding layer 242 can be Cu, Al, ferrite or carbonyl iron, stainless steel, nickel silver, low-carbon steel, silicon-iron steel, foil, epoxy, conductive resin, and other metals and composites capable of blocking or absorbing electromagnetic interference (EMI), radio frequency interference (RFI), and other inter-device interference. Shielding layer 242 can also be a non-metal material such as carbon-black or aluminum flake to reduce the effects of EMI and RFI. Shielding layer 242 is grounded through conductive pillars 230, shielding sides 244, or contact pads 234 and 236 to build-up interconnect structure 246 and bumps 252.

The temporary carrier is removed by chemical etching, mechanical peel-off, CMP, mechanical grinding, thermal bake, laser scanning, or wet stripping. A bottom-side build-up interconnect structure 246 is formed over conductive pillars 230, semiconductor die 232, and encapsulant 238. The build-up interconnect structure 246 includes an insulating or passivation layer 248 containing one or more layers of SiO2, Si3N4, SiON, Ta2O5, Al2O3, or other material having similar insulating and structural properties. The insulating layer 248 is formed using PVD, CVD, printing, spin coating, spray coating, sintering or thermal oxidation.

The bottom-side build-up interconnect structure 246 further includes an electrically conductive layer 250 formed in insulating layer 248 using a patterning and deposition process such as PVD, CVD, sputtering, electrolytic plating, electroless plating process. Conductive layer 250 can be one or more layers of Al, Cu, Sn, Ni, Au, Ag, or other suitable electrically conductive material. One portion of conductive layer 250 is electrically connected to conductive pillars 230 and contact pads 234 of semiconductor die 232. Other portions of conductive layer 250 can be electrically common or electrically isolated depending on the design and function of the semiconductor device.

An electrically conductive bump material is deposited over build-up interconnect structure 246 and electrically connected to conductive layer 250 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 250 using a suitable attachment or bonding process. In one embodiment, the bump material is reflowed by heating the material above its melting point to form spherical balls or bumps 252. In some applications, bumps 252 are reflowed a second time to improve electrical contact to conductive layer 250. The bumps can also be compression bonded to conductive layer 250. Bumps 252 represent one type of interconnect structure that can be formed over conductive layer 250. The interconnect structure can also use bond wires, stud bump, micro bump, or other electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a plurality of conductive pillars;
   disposing a first dual-active sided semiconductor die between the conductive pillars, the first dual-active sided semiconductor die including first and second opposing active surfaces with first contact pads on the first active surface and second contact pads on the second active surface, wherein a height of the conductive pillars is greater than a height of the first dual-active sided semiconductor die;
   depositing an encapsulant over the first dual-active sided semiconductor die and around the conductive pillars with the encapsulant covering the first active surface of the first dual-active sided semiconductor die, wherein a first surface of the encapsulant is coplanar with a surface of the conductive pillars;
   forming a plurality of vias through the first surface of the encapsulant with the vias extending from the first surface of the encapsulant through the encapsulant to the first contact pads of the first dual-active sided semiconductor die;
   depositing a conductive material in the vias to form a plurality of conductive vias in the encapsulant with the conductive vias extending from the first contact pads through the encapsulant to the first surface of the encapsulant;
   forming a first interconnect structure over the first surface of the encapsulant, wherein the first interconnect structure is electrically connected to the conductive pillars and through the conductive vias to the first contact pads of the first dual-active sided semiconductor die; and
   forming a second interconnect structure over a second surface of the encapsulant opposite the first surface of the encapsulant with the second interconnect structure physically contacting the conductive pillars and the second contact pads of the first dual-active sided semiconductor die.

2. The method of claim 1, further including forming a heat sink over the first interconnect structure.

3. The method of claim 1, wherein the first interconnect structure includes a shielding layer.

4. The method of claim 1, further including disposing a second dual-active sided semiconductor die adjacent to the first dual-active sided semiconductor die, the second dual-active sided semiconductor die including first and second opposing active surfaces with first contact pads on the first active surface of the second dual-active sided semiconductor die and second contact pads on the second active surface of the second dual-active sided semiconductor die.

5. A method of making a semiconductor device, comprising:
   providing a plurality of conductive pillars;
   disposing a first semiconductor component between the conductive pillars, the first semiconductor component including first and second opposing active surfaces with first contact pads on the first active surface and second contact pads on the second active surface;
   depositing an encapsulant around the first semiconductor component and conductive pillars;
   forming a first interconnect structure over a first surface of the encapsulant and electrically connected to the conductive pillars and first contact pads of the first semiconductor component;
   forming a plurality of interconnects in the encapsulant and extending from the first contact pads of the first semiconductor component to the first surface of the encapsulant; and
   forming a second interconnect structure over a second surface of the encapsulant opposite the first surface of the encapsulant with the second interconnect structure physically contacting the conductive pillars and second contact pads of the first semiconductor component.

6. The method of claim 5, further including forming a heat sink over the first interconnect structure.

7. The method of claim 5, wherein the first interconnect structure includes a shielding layer.

8. The method of claim 5, further including stacking a second semiconductor component over the first semiconductor component.

9. The method of claim 5, further including disposing a second semiconductor component adjacent to the first semiconductor component.

10. The method of claim 5, wherein the first surface of the encapsulant is coplanar with the conductive pillars.

11. A method of making a semiconductor device, comprising:
   providing a first semiconductor component including first and second opposing active surfaces with first contact pads on the first active surface and second contact pads on the second active surface;
   forming a plurality of conductive pillars adjacent to the first semiconductor component with the conductive pillars including a height greater than a height of the first semiconductor component;
   depositing an encapsulant over the first semiconductor component and around the conductive pillars with the encapsulant including a first surface disposed over the first active surface of the first semiconductor component, wherein the first surface of the encapsulant is coplanar with a surface of the conductive pillars;

forming a plurality of conductive vias in the encapsulant and over the first active surface of the first semiconductor component with the conductive vias extending from the first surface of the encapsulant through the encapsulant to the first contact pads of the first semiconductor component; and forming a first interconnect structure over the first surface of the encapsulant and electrically connected to the conductive pillars and the conductive vias.

12. The method of claim 11, further including forming a second interconnect structure over a second surface of the encapsulant opposite the first surface of the encapsulant.

13. The method of claim 11, further including disposing a heat sink over the first interconnect structure.

14. The method of claim 11, further including stacking a second semiconductor component over the first semiconductor component.

15. The method of claim 11, further including disposing a second semiconductor component adjacent to the first semiconductor component.

16. A method of making a semiconductor device, comprising:

providing a first semiconductor component including a first active surface and a second active surface opposite the first active surface;

forming a conductive pillar adjacent to the first semiconductor component;

depositing an encapsulant around the conductive pillar and over the first semiconductor component with the encapsulant including a first surface disposed over the first active surface of the first semiconductor component, wherein the first surface of the encapsulant is coplanar with the conductive pillar;

disposing a first interconnect in the encapsulant with the first interconnect extending from the first surface of the encapsulant to a first contact pad on the first active surface of the first semiconductor component; and forming a first interconnect structure over the first surface of the encapsulant and electrically connected to the conductive pillar and the first interconnect.

17. The method of claim 16, further including forming a second interconnect structure over the second active surface of the first semiconductor component.

18. The method of claim 16, wherein the interconnect includes a bump.

19. The method of claim 16, wherein the first interconnect structure includes a shielding layer.

20. The method of claim 16, further including:

forming a second interconnect over a second contact pad on the second active surface of the first semiconductor component; and depositing the encapsulant over the second active surface of the first semiconductor component and around the second interconnect.

* * * * *